United States Patent [19]

Hamada

[11] Patent Number: 5,475,238
[45] Date of Patent: Dec. 12, 1995

[54] THIN FILM TRANSISTOR WITH A SUB-GATE STRUCTURE AND A DRAIN OFFSET REGION

[75] Inventor: Koji Hamada, Tokyo, Japan

[73] Assignee: NEC Corporation, Tokyo, Japan

[21] Appl. No.: 150,537

[22] Filed: Nov. 8, 1993

Related U.S. Application Data

[63] Continuation of Ser. No. 953,704, Sep. 30, 1992, abandoned.

[30] Foreign Application Priority Data

Sep. 30, 1991 [JP] Japan .................................. 3-250780

[51] Int. Cl.[6] .......................... H01L 29/76; H01L 29/04; H01L 31/036; H01L 29/94
[52] U.S. Cl. ................. 257/66; 257/57; 257/61; 257/365; 257/366
[58] Field of Search ................... 257/57, 61, 66, 257/365, 366

[56] References Cited

U.S. PATENT DOCUMENTS 5,124,769  6/1992  Tanaka et al. ............................. 257/66
5,266,507  11/1993  Wu ............................................ 257/66

OTHER PUBLICATIONS

IEEE Electron Device Letters, vol. 11, No. 11, Nov. 1990, "Device Sensitivity of Field–Plated Polysilicon High–Voltage TFT's and Their Application to Low Voltage Operation", by Huang et al. pp. 541–543.

"Field–Induction–Drain (FID) Poly–Si TFTs with High On/Off Current Ratio", Extended Abstracts of the 22nd (1990 International) Conference on Solid State Devices and Materials, Sendai, 1990, by Keiji Tanaka, et al., pp. 1011–1014.

"The Influence of Substrate Bias on Bottom Gate Type Poly Si TFTs", by K. Hamada et al., VLSI Development Division, NEC Corporation, one page, including English language statement of relevance.

Primary Examiner—Steven H. Loke
Attorney, Agent, or Firm—Burns, Doane, Swecker & Mathis

[57] ABSTRACT

A novel structure of a polycrystalline silicon thin film transistor manifested in a drain offset region and a sub-gate structure. The drain offset region is formed between a channel region and a drain region in the polycrystalline silicon thin film. The sub-gate structure comprises at least one sub-gate, except for a main gate which is provided in a normal field effect transistor. This structure is applicable to either an upper gate type or a bottom gate type thin film transistor. The sub-gate structure may include an upper sub-gate and/or a bottom sub-gate. The upper sub-gate overlays the channel region, drain offset and drain regions through an insulation layer. The bottom sub-gate underlies the channel region, drain offset and drain regions through an insulation layer. The sub-gate is applied with the same voltage or less as the drain voltage thereby permitting a relaxation of a high field concentration caused at a drain junction to be realized. This may provide a reduction of a leakage current and a security of a high ON-current.

3 Claims, 5 Drawing Sheets

THIN FILM TRANSISTOR WITH A SUB-GATE STRUCTURE AND A DRAIN OFFSET REGION

This application is a continuation of application Ser. No. 07/953,704, filed Sep. 30, 1992, now abandoned.

BACKGROUND OF THE INVENTION

The invention relates to a thin film transistor (TFT), and more particularly to an improved thin film transistor mainly used for a load device of static random access memories (SRAMs) or liquid crystal displays (LCDs).

In recent years, thin film transistors (TFTs) including a thin film semiconductor are likely to be considered. Especially such thin film transistors has successfully been applied to load devices of the static random access memories (SRAMS) or switching devices in an active matrix circuitry for liquid crystal displays (LCDs).

The prior art thin film transistor, or an upper gate (coplanar) type thin film transistor will now be described with reference to FIG. 1. A silicon substrate 1 is prepared and a silicon oxide film 2 is formed on the silicon substrate 1. Subsequently, a polycrystalline silicon film is deposited on the silicon oxide film 2. By using normal processes for MOSFETs, a gate oxide film 7, a channel region 6, a gate electrode 8, source and drain regions 3 and 4 and an insulation film 9a are formed to complete the prior art thin film transistor. For those processes, the polycrystalline silicon film is subjected to an ion-implantation by using the gate electrode 8 as a mask thereby resulting in formations of self-aligned source and drain regions 3 and 4. Concurrently, the channel region 6 is defined by the source and drain regions 3 and 4 so that the channel region 6 is aligned directly under the gate electrode 8.

A bottom gate type thin film transistor will be described with reference to FIG. 2. A silicon substrate 1 is prepared and a silicon oxide film 2 is formed on the silicon substrate 1. After that, a gate electrode 8 made of polycrystalline silicon and a gate oxide film 7 are formed in turn. Subsequently, a polycrystalline silicon film is deposited on the gate oxide film 7. The polycrystalline silicon film is subjected to an ion-implantation by using a photoresist as a mask so that source and drain regions 3 and 4 are formed. Concurrently, a channel region 6 is defined by the source and drain regions 3 and 4. As a result of those, the channel region 6 is provided directly over the gate electrode 8. Further, an insulation film 9a is deposited on the source, drain and channel regions 3, 4 and 6, after which a heat treatment is accomplished to complete the thin film transistor.

By the way, it is desired that such thin film transistors possess a reduced leakage current and a higher driving ability. To realize these characteristics, the channel region 6 requires a high quality polycrystal of a semiconductor thin film, for which a laser annealing for recrystallization or an electron beam annealing has been used to improve the quality of polycrystal. It should, however, be considered that such crystallization techniques have not been established under the existing circumstances in mass production, at appropriate cost and reproduction of the device.

Generally, amorphous silicon and polycrystalline silicon are used in a channel region formed of a semiconductor thin film. The polycrystalline silicon thin film which has previously been utilized is likely to be suitable to realize a higher performance thin film transistor rather than the amorphous silicon thin film. Nevertheless, the polycrystalline silicon film comprises the large number of crystal grains, each of which tends to include many crystal defects such as a twin crystal, which is undesirable. Such crystal defects cause the leakage current to be increased. In addition, such crystal defects and rough surfaces of the film also cause the drift mobility of carriers to be reduced. Those make performance characteristics of the thin film transistor inferior.

SUMMARY OF THE INVENTION

Accordingly, it is an object of the present invention to provide a novel structure of a polycrystalline silicon thin film transistor, which permits the leakage current to be reduced.

It is another object of the present invention to provide a novel structure of a polycrystalline silicon thin film transistor, which permits securing a higher ON-current.

The above and other objects, features and advantages of the present invention will be apparent from following descriptions.

In accordance with the present invention, a novel structure of a polycrystalline silicon thin film transistor is analogous to a normal field effect thin film transistor, except for existences of a sub-gate structure and a drain offset region. The transistor includes a polycrystalline silicon thin film which comprises a source region, a channel region abutting the source region, a drain offset region abutting the channel region and a drain region abutting the drain offset region. Those structures having the sub-gate structure and the drain offset region are applicable to either an upper gate type or a bottom gate type thin film transistor.

In the upper gate type thin film transistor, the polycrystalline silicon thin film including each of the source, drain, channel and drain offset regions overlays an insulation layer on a silicon substrate. A main gate is provided over the channel region through a gate insulation film. The existence of the drain offset region allows a separation of the drain region from the main gate as well as the channel region. For the sub-gate structure, it is available to provide an upper sub-gate overlaying the main gate, drain offset and drain regions through an isolation film. Alternatively, it is available to provide a bottom sub-gate underlying the channel, drain offset and drain regions in which the bottom sub-gate region is formed in the insulation layer so as to be isolated from the above regions. Needless to say, it is also available to provide both the upper and bottom sub-gates.

On the other hand, in the bottom gate type thin film transistor, a main gate is provided on an insulation layer on a silicon substrate. A gate insulation film covers the main gate and other regions of the insulation layer. The polycrystalline silicon film including the source, drain, channel and drain offset regions overlays the gate insulation film in which the channel region exists directly over the main gate. The upper sub-gate overlays the channel, drain offset and drain regions through an isolation film. The bottom sub-gate underlies the main gate, drain offset and drain regions in which the bottom sub-gate exists in the insulation layer so as to be separated from the above regions.

The above sub-gate may be applied with the same voltage as the drain region or less. Such novel structures manifested in the drain offset region and the sub-gate structure permit electric fields in the drain offset region as well as the channel region to effectively be controlled. This realizes a relaxation of a high field concentration caused at a drain junction. Those results are that a leakage current is substantially reduced and a high ON-current is secured.

BRIEF DESCRIPTION OF THE DRAWINGS

Preferred embodiments of the present invention will hereinafter fully be described in detail with reference to the accompanying drawings.

PREFERRED EMBODIMENTS OF THE INVENTION

Figure 1:
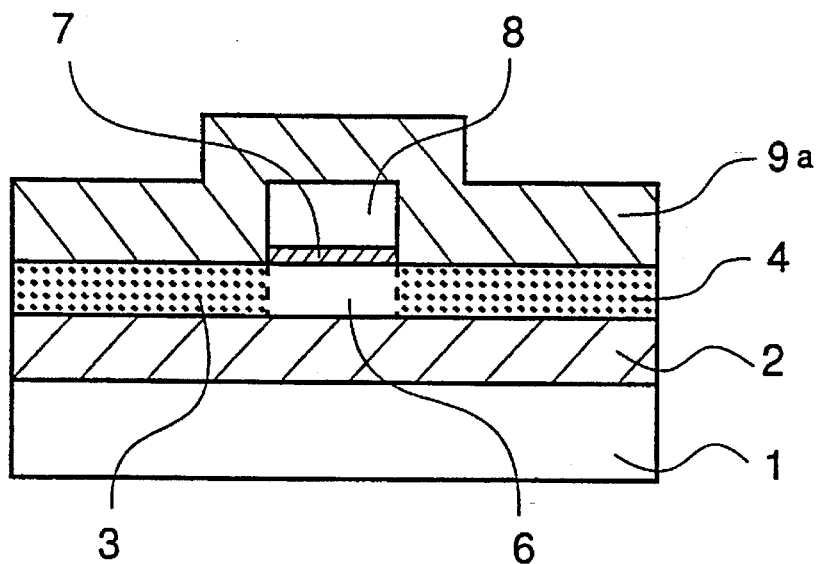
FIG. 1 is a fragmentary cross sectional elevation view illustrative of the conventional structure of the upper gate type thin film transistor.
Figure 2:
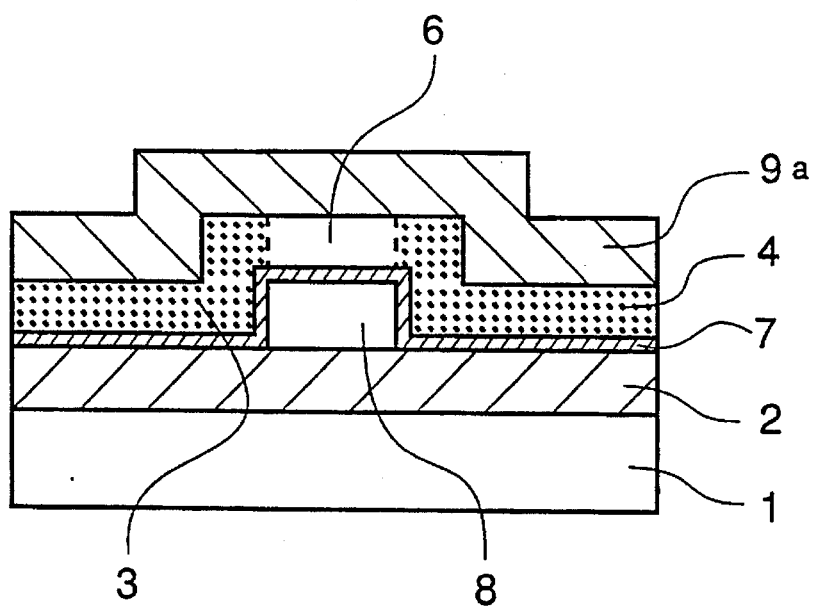
FIG. 2 is a fragmentary cross sectional elevation view illustrative of the conventional structure of the bottom gate type thin film transistor.
Figure 3:
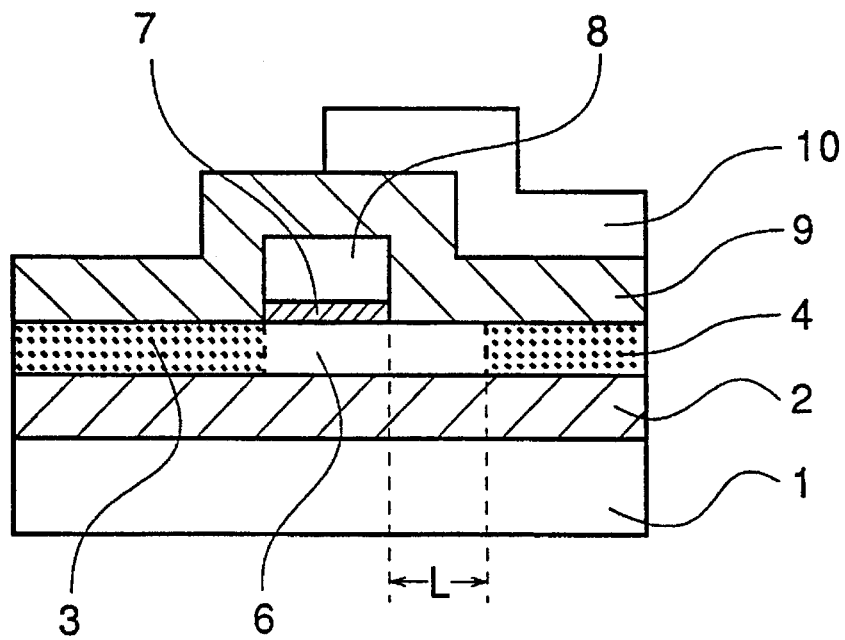
FIG. 3 is a fragmentary cross sectional elevation view illustrative of a novel structure of an upper gate type thin film transistor of a first embodiment according to the present invention.

A first embodiment of the present invention will now be described with reference to FIG. 3 in which a novel device is a p-channel upper gate (coplanar) thin film transistor.

A silicon substrate 1 is prepared after which a silicon oxide film 2 is formed on the silicon substrate 1. An amorphous silicon film is deposited up to a thickness of approximately 100 nanometers on the silicon oxide film 2 by using a deposition method such as a low pressure chemical vapor deposition method in which a disilane ($SiH_6$) gas is used as a growth gas. After that, the amorphous silicon film is subjected to a heat treatment in a nitrogen atmosphere at a temperature of 600° C. for 16 hours so that the amorphous silicon film is crystallized to form a polycrystalline silicon film.

Subsequently, a gate oxide film 7 is deposited up to a thickness of 40 nanometers by using a chemical vapor deposition before an ion-implantation of phosphorus (P) into the polycrystalline silicon film is accomplished to form an n-type channel-region 6. A gate electrode 8 is formed on the gate oxide film 7, after which an ion-implantation of boron fluoride ($BF_2$) into the polycrystalline silicon film is accomplished by using a photoresist as a mask to form source and drain regions 3 and 4. Concurrently, a drain offset region which is undoped with boron fluoride having a predetermined length L is defined by the channel region 6 and the drain region 4. Namely, the ion-implantation of boron fluoride is so accomplished that the drain offset region is formed between the channel region 6 and the drain region 4.

Further, an interlayer insulator 9 is deposited on the device. After that, an upper sub-gate 10 is formed on the interlayer insulator 9 so as to overlay at least a part of the drain region, the drain offset region L and the gate electrode 8.

The novel structure of the thin film transistor is manifested in the sub-gate 10 and the drain offset region, but the source and drain regions 3 and 4 in addition to the main gate 8 and the channel region 6 are analogous to the normal FET structures. The sub-gate 10 may be taken to the same potential as the drain 4. It is also available that the sub-gate 10 is applied with a predetermined voltage in the range from 0 V to the same voltage as the drain 4.

Figure 9:
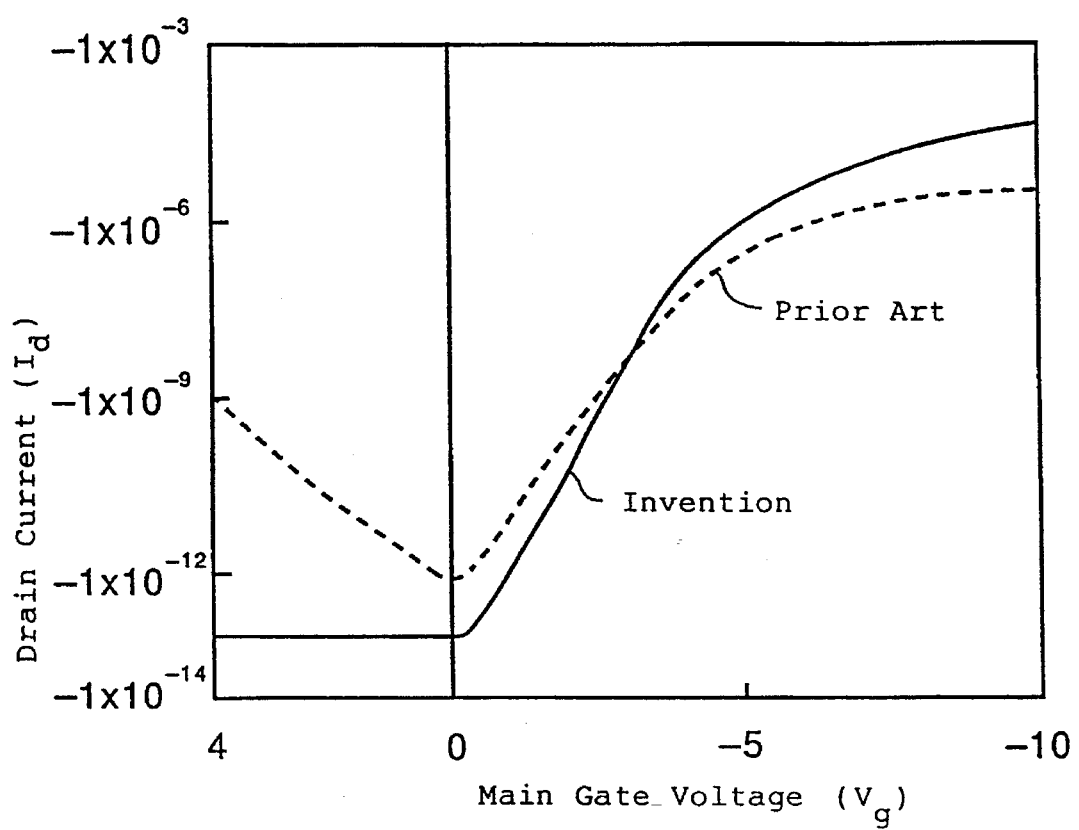
FIG. 9 is a diagram illustrative of drain current—gate voltage characteristics of a novel thin film transistor according to the present invention under comparison with the conventional thin film transistor.

The existence of the drain offset region permits a high electric field caused at the drain junction region to be relaxed. Additionally, the predetermined applied voltage to the sub-gate 10 allows an electric field at the drain offset region to effectively be controlled. The drain current—gate voltage characteristics are measured over following conditions. With regard to the device size, the gate length is 1.0 micrometer and the gate width is also 1.0 micrometer. The source voltage $V_s$ is 0 V, the drain voltage $V_d$ is −5 V and main gate voltage $V_g$ is in the range from +4 V to −10 V. The sub-gate voltage $V_{sg}$ is −5 V. The results of the measurement are shown in FIG. 9, form which the leakage current and ON-current characteristics may be evaluated. As compared with the prior art thin film transistor, the leakage current is substantially be reduced but the ON-current from the source region 3 to the drain region 4 is effectively increased. Those reasons are likely to be as follows. The negative voltage applied to the sub-gate 10 permits the relaxation of the electric field at the drain junction whereby the leakage current to be reduced. Also, the negative voltage applied to the sub-gate 10 causes an inversion layer in the drain offset region thereby permitting a high ON-current from the source region 3 to the drain region 4 to be secured.

Figure 4:
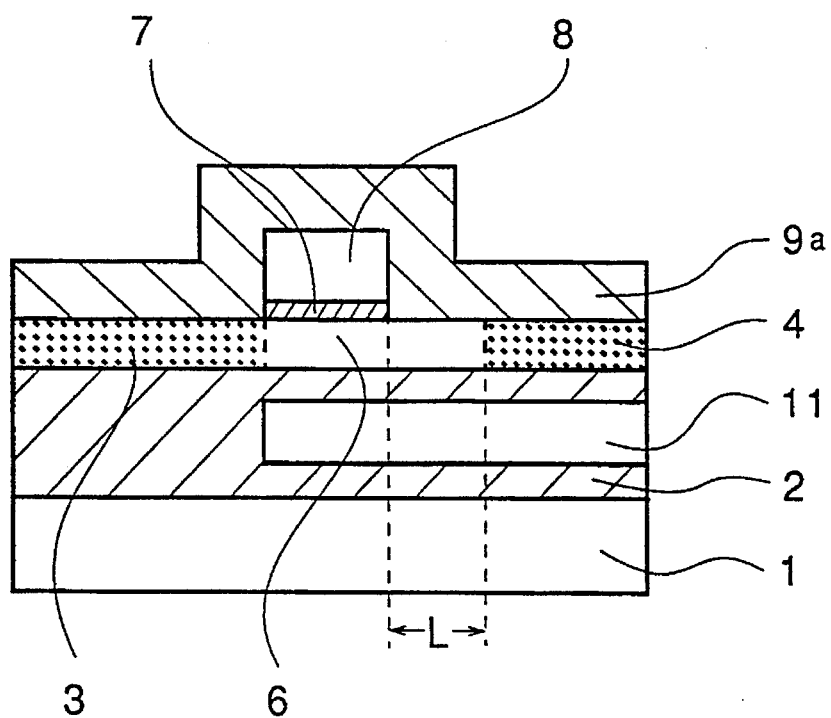
FIG. 4 is a fragmentary cross sectional elevation view illustrative of another novel structure of an upper gate type thin film transistor of a second embodiment according to the present invention.

A second embodiment of the present invention will subsequently be described with reference to FIG. 4 in which the embodiment provides a novel four terminal device of the p-channel upper gate (coplanar) thin film transistor.

A silicon oxide film 2 including a sub-gate 11 is formed on a silicon substrate 1. A polycrystalline silicon thin film covers the entire surface of the silicon oxide film 2. The polycrystalline silicon thin film includes a source region 3, a channel region 6 abutting the source region 3, a drain offset region having a predetermined length L abutting the channel region 6 and the drain region 4 abutting the drain offset region L. A main gate 8 is provided directly over the channel region 6 through a gate oxide film 7. An interlayer insulator film 9a covers an entire surface of the device.

The silicon oxide film 2 completely isolates the bottom sub-gate 11 from both the silicon substrate 1 and the polycrystalline silicon thin film including the source, drain, channel and drain offset regions 3, 4, 6 and L. The bottom sub-gate 11 exists under the channel region 6, the drain offset region L and the drain region 4. The bottom sub-gate 11 may be applied with a predetermined voltage associated with the drain voltage.

The existence of the drain offset region L permits a high electric field at the drain Junction region to be relaxed.

Additionally, the predetermined applied voltage to the sub-gate 11 allows an electric field at the drain offset region L to effectively be controlled. Also, in this. embodiment, the leakage current is substantially be reduced but the ON-current is effectively increased. Those reasons are likely to be as follows. The predetermined voltage applied to the bottom sub-gate 11 permits the relaxation of the electric field at the drain Junction whereby enabling the leakage current to be reduced. Also, the predetermined voltage applied to the bottom sub-gate 11 causes an inversion layer in the drain offset region thereby permitting the ON-current to be increased.

Figure 5:
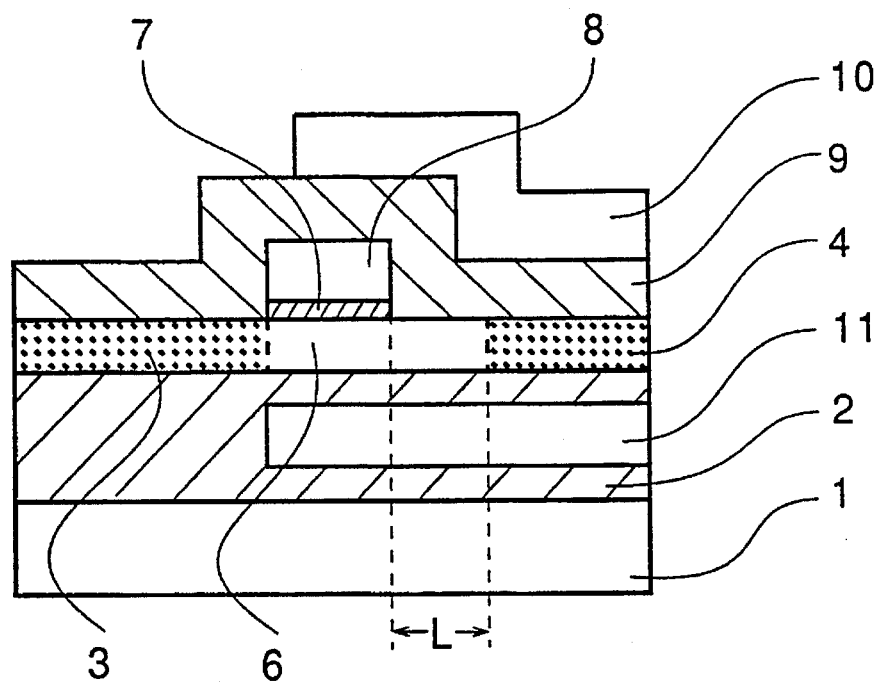
FIG. 5 is a fragmentary cross sectional elevation view illustrative of still another novel structure of an upper gate type thin film transistor of a third embodiment according to the present invention.

A third embodiment of the present invention will subsequently be described with reference to FIG. 5, which provides a five terminal device of the p-channel upper gate thin film transistor.

A silicon oxide film 2 including a bottom sub-gate 11 is formed on a silicon substrate 1. A polycrystalline silicon thin film overlays the silicon oxide film 2. The polycrystalline silicon thin film includes a source region 3, a channel region 6 abutting the source region 3, a drain offset region having a predetermined length L abutting the channel region 6 and the drain region 4 abutting the drain offset region. A main gate 8 is provided directly over the channel region 6 through a gate oxide film 7. An interlayer insulator film 9a covers an entire surface of the device. Further, in this embodiment, an upper sub-gate 10 is provided on the interlayer insulator film 9.

The silicon oxide film 2 completely isolates the bottom sub-gate 11 from both the silicon substrate 1 and the polycrystalline silicon thin film including the source 3, drain 4, channel 6 and drain offset regions. The bottom sub-gate 11 exists under the channel region 6, the drain offset region and the drain region 4. The upper sub-gate 10 underlies the main gate 8, the drain offset region and the drain region 4 through the interlayer insulator film 9. The upper and bottom sub-gates 10 and 11 may respectively be applied with predetermined voltages associated with the drain voltage.

The existence of the drain offset region permits a high electric field at the drain junction region to be relaxed. Additionally, the predetermined applied voltages to the upper and bottom sub-gates 10 and 11 may control an electric field at the drain offset region. Also, in this embodiment, the leakage current is substantially be reduced but the ON-current is effectively increased. The predetermined voltages applied to the upper and bottom subgates 10 and 11 permit the relaxation of the electric field at the drain junction thereby the leakage current to be reduced. Also, the predetermined voltages applied to the upper and bottom sub-gates 10 and 11 cause an inversion layer in the drain offset region thereby permitting the ON-current to be increased.

Figure 6:
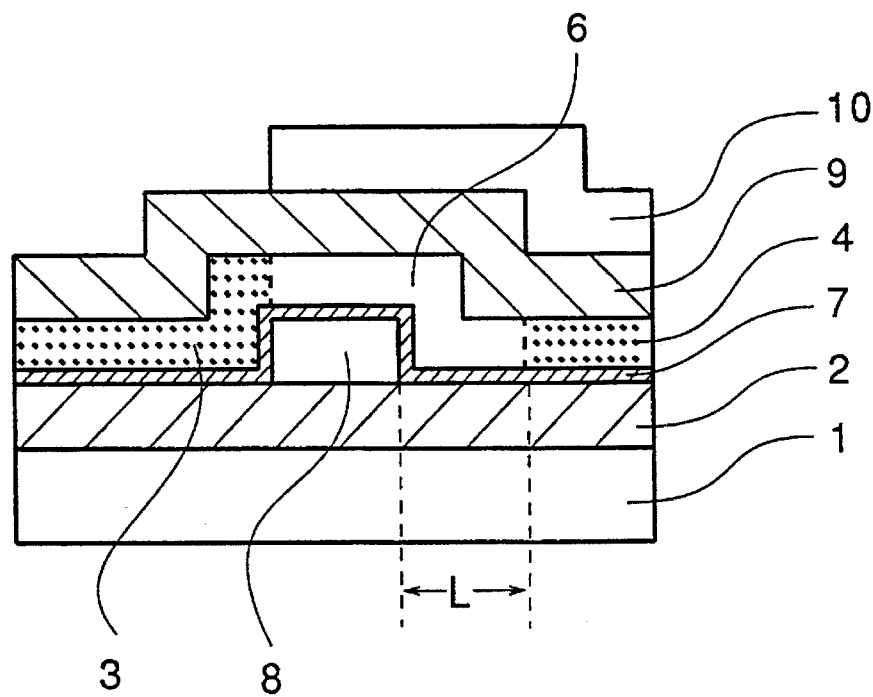
FIG. 6 is a fragmentary cross sectional elevation view illustrative of a novel structure of a bottom gate type thin film transistor of a fourth embodiment according to the present invention.

A fourth embodiment of the present invention will now be described with reference to FIG. 6 in which a novel device is a n-channel bottom gate thin film transistor.

A silicon substrate 1 is prepared after which a silicon oxide film 2 is formed on the silicon substrate 1. A gate electrode 8 is formed on the silicon oxide film 2. Subsequently, a gate oxide film 7 is deposited on the entire surface of the device up to a thickness of 40 nanometers by using a chemical vapor deposition. An amorphous silicon film is deposited up to a thickness of approximately 100 nanometers on the gate oxide film 7 by using a deposition method such as a low pressure chemical vapor deposition method in which a disilane ($SiH_6$) gas is used as a growth gas. After that, the amorphous silicon film is subjected to a heat treatment in a nitrogen atmosphere at a temperature of 600° C. for 16 hours so that the amorphous silicon film is completely crystallized to form a polycrystalline silicon film.

Subsequently, an ion-implantation of boron (B) into the polycryetalline silicon film is accomplished to form an p-type channel region 6. An ion-implantation of arsenic (As) into the polycrystalline silicon film is accomplished by using a photoresist as a mask to form source and drain regions 3 and 4. Concurrently, a drain offset region which is undoped with arsenic having a predetermined length L is defined by the channel region 6 and the drain region 4. Namely, the ion-implantation of arsenic is so accomplished that the drain offset region is formed between the channel region 6 and the drain region 4.

Further, an interlayer insulator 9 is deposited on the device. After that, an upper sub-gate 10 is formed on the interlayer insulator 9 so as to overlay at least a part of the drain-region, the drain offset region L and the channel region 6.

The novel structure of the thin film transistor is analogous to the normal FET structure of source and drain regions 3 and 4 and the main gate 8, except for the existence of both the drain offset region and the upper sub-gate 10. Namely, the novel structure is manifested in the sub-gate 10 and the drain offset region. The upper sub-gate 10 may be taken into the same potential as the drain 4. It is also available that the sub-gate 10 is applied with a predetermined voltage in the range from 0 V to the same voltage as the drain 4.

The existence of the drain offset region permits a high field concentration caused at the drain junction region to effectively be relaxed, in addition the inversion layer to be caused in the drain offset region. Namely, the predetermined applied voltage to the upper sub-gate 10 allows an electric field at the drain offset region to effectively be controlled. As a result of those, the leakage current is substantially be reduced but the ON-current is effectively increased. Those reasons tend to be as follows. The predetermined voltage applied to the upper sub-gate 10 permits the relaxation of the electric field at the drain junction whereby the leakage current to be reduced. Also, the negative voltage applied to the upper sub-gate 10 causes an inversion layer in the drain offset region thereby permitting the ON-current to be increased.

Figure 7:
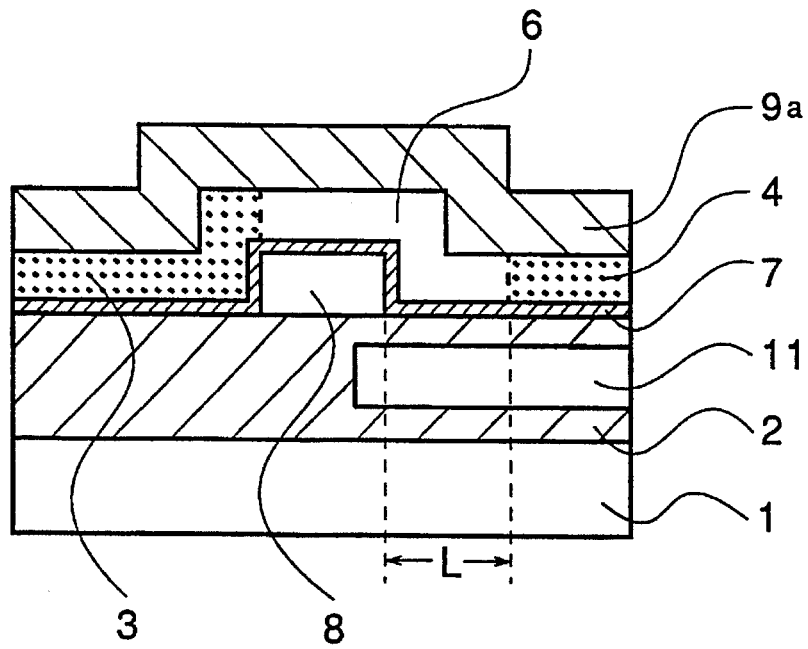
FIG. 7 is a fragmentary cross sectional elevation view illustrative of another novel structure of a bottom gate type thin film transistor of a fifth embodiment according to the present invention.

A fifth embodiment of the present invention will subsequently be described with reference to FIG. 7 in which the embodiment provides a novel four terminal device of the n-channel bottom gate thin film transistor.

A silicon oxide film 2 including a sub-gate 11 is formed on a silicon substrate 1. A main gate 8 is provided on the silicon oxide film 2. A gate oxide film 7 covers the main gate 8 and the silicon oxide film 2. A polycrystalline silicon film is overlays the gate oxide film 7. The polycrystalline silicon thin film includes a source region 3, a channel region 6 abutting the source region 3, a drain offset region having a predetermined length L abutting the channel region 6 and the drain region 4 abutting the drain offset region. The channel region 6 exist directly over the main gate 8 through the gate oxide film 7. The drain offset region having the length L is defined by the channel region 6 and the drain region 4. An interlayer insulator film 9a covers an entire surface of the device.

The silicon oxide film 2 completely isolates the bottom sub-gate 11 from both the silicon substrate 1 and the polycrystalline silicon thin film including the source 3, drain 4, channel 6 and drain offset regions. The bottom sub-gate 11 exists under the main gate 8, the drain offset region and the drain region 4. The bottom sub-gate 11 may be applied with a predetermined voltage associated with the drain voltage.

The existence of the drain offset region permits a relaxation of a high field concentration caused at the drain junction region and the inversion layer may be caused in the drain offset region. Additionally, the predetermined applied voltage to the sub-gate 11 allows an electric field at the drain offset region to effectively be controlled. Also, in this embodiment, the leakage current is substantially be reduced but the ON-current is effectively increased. Those reasons tend to be as follows. The predetermined voltage applied to the bottom sub-gate 11 permits the relaxation of the electric field at the drain Junction whereby providing a substantial reduction of the leakage current. Also, the predetermined voltage applied to the bottom sub-gate 11 causes an inversion layer in the drain offset region thereby permitting the ON-current to be increased.

Figure 8:
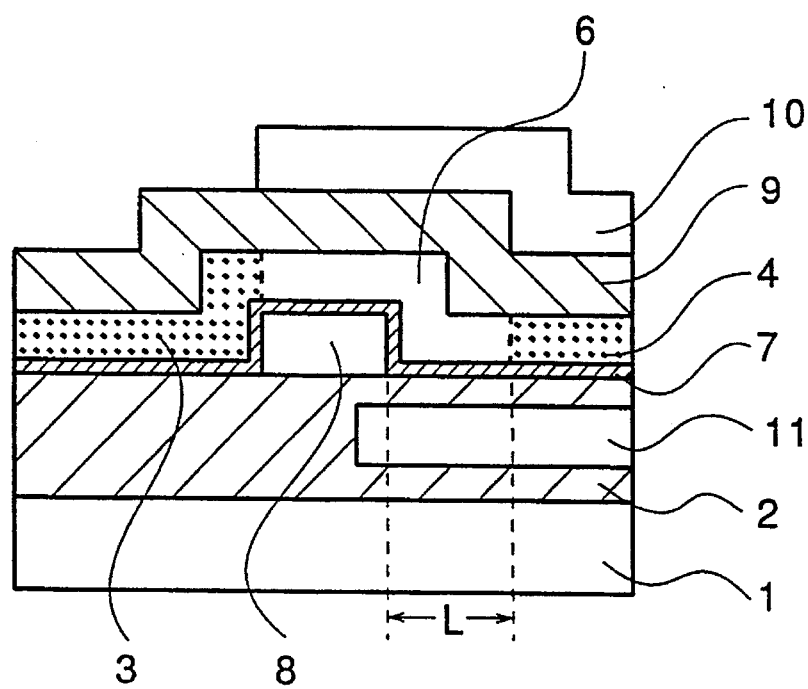
FIG. 8 is a fragmentary cross sectional elevation view illustrative of still another novel structure of a bottom gate type thin film transistor of a sixth embodiment according to the present invention.

A sixth embodiment of the present invention will subsequently be described with reference to FIG. 8, which provides a five terminal device of the n-channel bottom gate thin film transistor.

A silicon oxide film 2 including a bottom sub-gate 11 is formed on a silicon substrate 1. A main gate 8 iS provided on the silicon oxide film 2. A gate oxide film 7 covers the main gate 8 and the silicon oxide film 2. A polycrystalline silicon thin film is provided on the gate oxide film 7. The polycrystalline silicon thin film also includes a source region 3, a channel region 6 abutting the source region 3, a drain offset region having a predetermined length L abutting the channel region 6 and the drain region 4 abutting the drain offset region. The channel region 6 exists directly over the main gate 8 through the gate oxide film 7. An interlayer insulator film 9 covers the entire surface of the polycrystalline silicon thin film. Further, in this embodiment, an upper sub-gate 10 is provided on the interlayer insulator film 9.

The silicon oxide film 2 completely isolates the bottom sub-gate 11 from both the silicon substrate 1 and the polycrystalline silicon thin film including the source 3, drain 4, channel 6 and drain offset regions. The bottom sub-gate 11 exists under the main gate 8, the drain offset region and the drain region 4. The upper sub-gate 10 exists over the main gate 8, the drain offset region and the drain region 4 through the interlayer insulator film 9. The upper and bottom sub-gates 10 and 11 may respectively be applied with predetermined voltages associated with the drain voltage.

The existence of the drain offset region permits a high field concentration caused at the drain junction region to be relaxed. Additionally, the predetermined applied voltages to the upper and bottom sub-gates 10 and 11 may control an electric field at the drain offset region and cause the inversion layer in the drain offset region. Thus, the leakage current is substantially be reduced but the ON-current is effectively increased. Those reason are as follows. The predetermined voltages applied to the upper and bottom sub-gates 10 and 11 permit the relaxation of the high field concentration caused at the drain junction thereby enable the leakage current to be reduced. Also, the predetermined voltages applied to the upper and bottom sub-gates 10 and 11 cause the inversion layer in the drain offset region thereby permitting the ON-current to be increased.

Needless to say, the novel structure manifested in the sub-gate structure and the drain offset region is applicable to other types of thin film field effect transistors, although the structures will not be illustrated. The polycrystalline silicon film including the source, drain, channel and drain offset regions is provided on an insulation substrate such as a glass substrate, a ceramic substrate or a quartz substrate. In this case, the sub-gate is provided over the main gate, drain offset and drain regions through an insulation film. The sub-gate is applied with a predetermined voltage to control the electric field in the drain offset region thereby preventing the high field concentration to be caused at the drain Junction. Then, the leakage current is effectively reduced. In addition the subgate voltage causes the inversion layer in the drain offset region whereby a high ON-current is secured.

With respect to the sub-gate structure, the positions of the upper and/or bottom sub-gate are variable on condition that the electric field at least of the drain offset region may be controlled by the applied sub-gate voltage whereby permitting a relaxation of a high field concentration caused at the drain junction to effectively be realized. This result is that the thin film transistor may be free from the leakage current caused by undesirable factors such as a high field concentration, crystal defects at the drain junction. Also, the applied sub-gate voltage causes the inversion layer in the drain offset region thereby securing a high ON-current from the source region to the drain region. Further, the voltage to be applied to the sub-gate may determined by matching variable conditions.

Further, the dopant materials in the source, channel and drain regions, the drain offset region length L and other device sizes are also variable.

whereas modifications of the present invention will no doubt be apparent to a person of ordinary skilled in the art, it is to be understood that the embodiments shown and described by way of illustration are by no means intended to be considered in a limiting sense. Accordingly, it is to be intended by the claims to cover all modifications of the invention which fall within the sprite and scope of the invention.

What is claimed is:

1. A thin film transistor comprising:

source and drain regions of one conductivity type provided over an insulation layer;

a channel region of a conductivity type opposite to said one conductivity type abutting said source region;

a drain offset region of said conductivity type opposite to said one conductivity type provided between said drain and channel regions;

a main gate provided under said channel region through a gate insulation film, said main gate being provided on said insulation layer; and a sub-gate structure comprising at least one sub-gate isolated from each of said source, drain, channel and drain offset regions, said sub-gate structure controlling a potential at least in said channel region and said drain offset region, and overlapping with at least a portion of said main gate and the entirety of said channel region.

2. The thin film transistor as claimed in claim 1, wherein said source, drain, channel and drain offset regions each comprise a single polycrystalline silicon thin film.

3. The thin film transistor as claimed in claim 1, wherein said sub-gate structure comprises an upper sub-gate overlaying said channel, drain offset and drain regions through an isolation film.

* * * * *